United States Patent [19]

Koshimaru

[11] Patent Number: 5,105,256
[45] Date of Patent: Apr. 14, 1992

[54] SEMICONDUCTOR DEVICE HAVING IMPROVED ELEMENT ARRANGEMENT STRONG AGAINST EXTERNAL SURGE VOLTAGE

[75] Inventor: Shigeru Koshimaru, Tokyo, Japan

[73] Assignee: NEC Corporation, Tokyo, Japan

[21] Appl. No.: 733,020

[22] Filed: Jul. 19, 1991

Related U.S. Application Data

[63] Continuation of Ser. No. 425,903, Oct. 24, 1989, abandoned.

[30] Foreign Application Priority Data

Oct. 24, 1988 [JP]  Japan .................................. 63-268600

[51] Int. Cl.$^5$ ..................... H01L 23/48; H01L 27/02; H01L 27/01
[52] U.S. Cl. .................... 357/68; 357/23.1; 357/41; 357/51; 357/65
[58] Field of Search .................. 257/23.1, 23.13, 41, 257/51, 65, 68

[56] References Cited

U.S. PATENT DOCUMENTS

| | | | |
|---|---|---|---|
| 4,692,781 | 9/1987 | Rounhra et al. | 357/41 |
| 4,757,368 | 7/1988 | Masunaga et al. | 357/51 |
| 4,785,343 | 11/1988 | Nezh | 357/23.1 |
| 4,803,527 | 2/1989 | Hatta et al. | 357/23.13 |

*Primary Examiner*—Andrew J. James
*Assistant Examiner*—Ngan Van Ngo
*Attorney, Agent, or Firm*—Sughrue, Mion, Zinn, Macpeak & Seas

[57] ABSTRACT

A semiconductor device having a high density structure and resistant against external abnormal electric charges is disclosd. The semiconductor device comprises an input diffusion resistor coupled to an external terminal and formed in a semiconductor substrate, a diffusion region formed in the semiconductor substrate and a voltage wiring having a contact portion connected to the diffusion region through at least one contact hole formed in an insulating layer covering the diffusion region. A first distance between a first end of the diffusion region close to the diffusion resistor and a first part of the contact portion nearest to the first end is made larger than a distance between a second end opposite to the first end of the diffusion region and a second part of the contact portion nearest to the second end.

6 Claims, 3 Drawing Sheets

SEMICONDUCTOR DEVICE HAVING IMPROVED ELEMENT ARRANGEMENT STRONG AGAINST EXTERNAL SURGE VOLTAGE

This is a continuation of application Ser. No. 07/425,903 filed Oct. 24, 1989 now abandoned.

BACKGROUND OF THE INVENTION

1. Field of the Invention

The present invention relates to a semiconductor device fabricated on a semiconductor substrate and, more particularly to an MOS semiconductor device.

2. Related Art

MOS semiconductor devices have been widely utilized in various fields. In such a MOS semiconductor device, an external terminal such as a signal input terminal is usually coupled to an internal circuit fabricated on a semiconductor substrate through an input diffusion resistor for suppressing an abnormal voltage such as surge applied to the external terminal. In accordance with the increase in the integration density of the semiconductor device, distances between elements formed in the semiconductor substrate are becoming shorter. Therefore, it is difficult to arrange the diffusion region serving as the resistor coupled to the external terminal apart from a diffusion region or regions of the internal circuit with relatively large distance therebetween. If another diffusion region is formed adjacent to the diffusion region serving as the resistor, a parasitic bipolar transistor is produced therebetween. In this case when an excessive voltage is applied to the external terminal and the input diffusion resistor and the above another diffusion region is supplied with a voltage, an abnormal current flows between the diffusion resistor and the above another diffusion region. As a result, a PN junction of the diffusion region or a wiring contacted therewith is likely to be destroyed. In order to avoid the above disadvantage, the diffusion resistor is formed with large distances from other diffusion regions. However, this approach is impractical because it requires a large area on the semiconductor substrate thus lowering the integration density.

SUMMARY OF THE INVENTION

It is an object of the present invention to provide a semiconductor device having an improved element arrangement which is hardly affected by an abnormal voltage.

It is another object of the present invention to provide an MOS semiconductor device fabricated with a large integration density and operable stably.

The semiconductor device according to the present invention comprises a semiconductor substrate of a first conductivity type, an insulating layer covering a major surface of the semiconductor substrate, a first diffusion region of a second conductivity type opposite to the first conductivity type at the surface of the semiconductor substrate, an external terminal, means for connecting the first diffusion region to the external terminal, a second diffusion region of the second conductivity type formed at the major surface of the semiconductor substrate in the vicinity of the first diffusion region, the second diffusion region having a first end nearest to the first diffusion region and a second end opposite to the first end, a voltage wiring having a contact area directly contacted with the second diffusion region through at least one contact hole formed in the insulating layer, the contact area having a first portion nearest to the first end and a second portion nearest to the second end, and is characterized in that a first distance between the first end and the first portion is made larger than a second distance between the second end and the second portion.

According to the present invention, the effective resistance between the voltage wiring and the first end nearest to the first diffusion region is remarkably increased. Therefore, the parasitic bipolar transistor effect between the first diffusion region and the second diffusion region can be suppressed.

BRIEF DESCRIPTION OF THE DRAWINGS

The above and further objects, features and advantages of the present invention will become more apparent from the following detailed description taken in conjunction with the accompanying drawings, wherein.

DETAILED DESCRIPTION OF THE INVENTION

Description of the Prior Art

Figure 1:
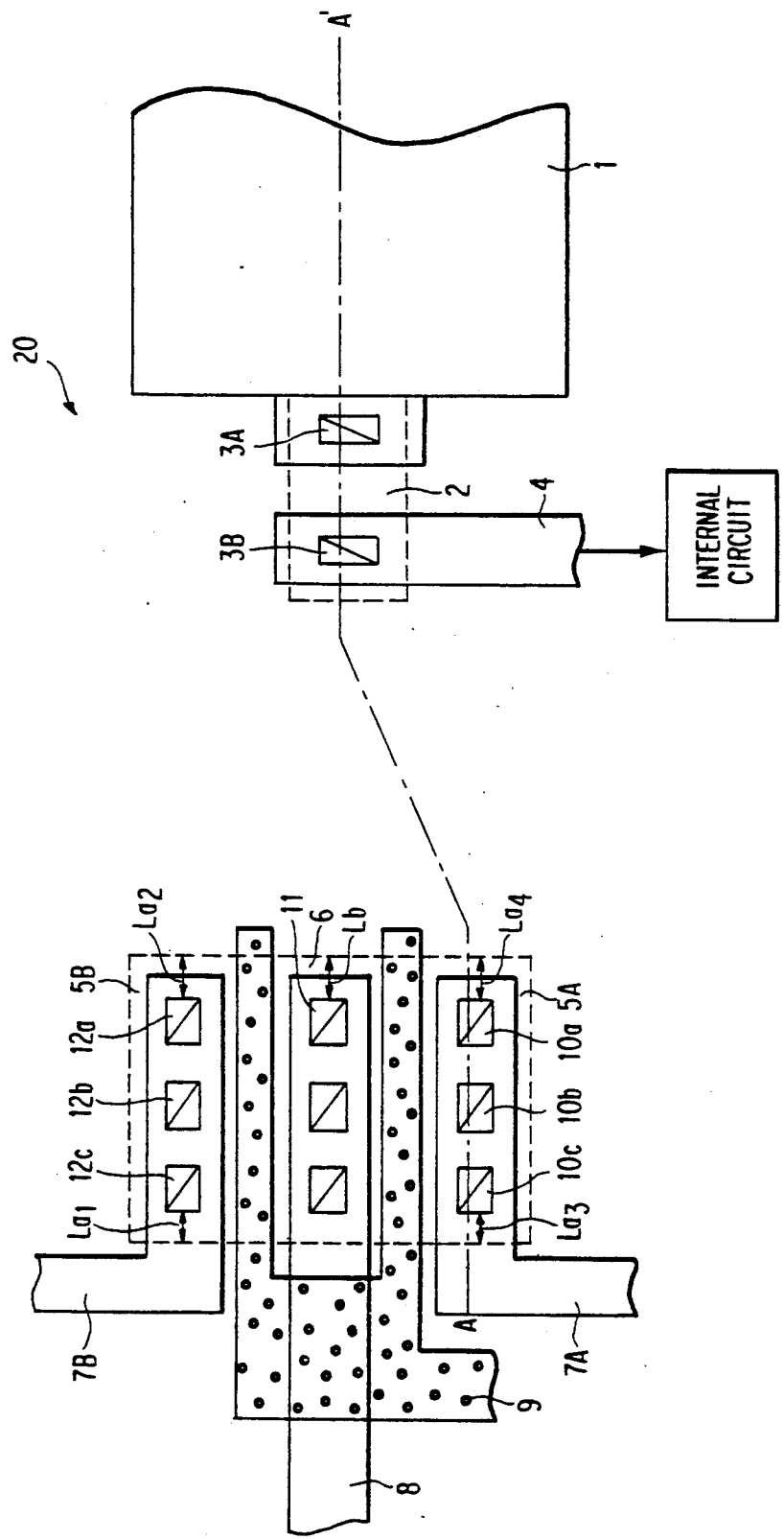
FIG. 1 is a plan view of a major part of a semiconductor device in the prior art.
Figure 2:
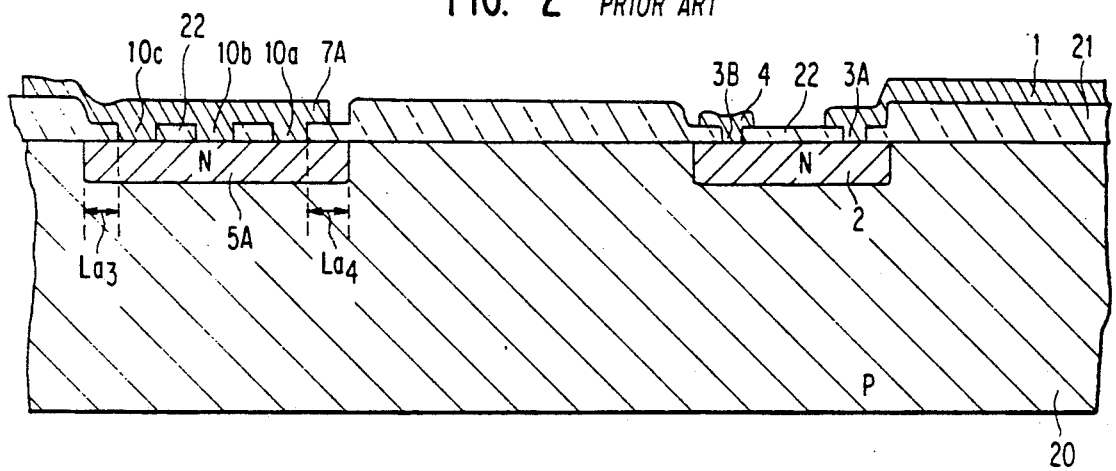
FIG. 2 is a sectional view along the axis A—A' of FIG. 1.

With reference to FIGS. 1 and 2, a semiconductor device in the prior art will be explained first. As shown in FIGS. 1 and 2, a bonding pad 1 serving as an external terminal is formed on a P-type semiconductor substrate 20 through a thick field insulating layer 21 and connected to one end portion of an N-type diffusion region 2 serving as a resistor through a contact hole 3A formed in an insulating layer 22 covering the surface of the region 2. An internal wiring 4 to be connected to an internal circuit is connected to another end portion of the region 2 through a contact hole 3B. The region 2 serves as a known input protection resistor. Also, a MOS field effect transitor is formed on the substrate relatively adjacent to the region 2. The transistor includes a drain region 6 of N-type, two split sources 5A and 5B of N-type, and a polycrystalline silicon layer 9 forming two split gate electrodes between the reigons 5A and 6 and the regions 5B and 6. A drain wiring 8 made of aluminum is connected to the drain region 6 through contact holes 11 formed in the insulating layer 22. Source wirings 7A and 7B made of aluminum are connected to the source regions 5A and 5B through contact holes 10a, 10b, 10c; 12a, 12b, 12c, respectively. The source wirings 7A and 7B are connected to a source voltage such as a ground potential.

As is seen from FIGS. 1 and 2, the contact holes 10a-10c, 12a-12c formed on the regions 5A and 5B are formed in symetrical patterns with the same value of distances (margins) $L_{a1}-L_{a4}$ and $L_b$ ($L_{a1}=L_{a2}=L_{a3}=L_{a4}=L_b$).

In order to minimize contact resistances, the margins ($L_{a1}-L_{a4}$) between the diffusion region and the contact is narrow (minimized) in the conventional semiconductor device. Therefore, when electrostatic noise is given to the input pad 2, in the current device which is highly integrated and has large capacity and in which the diffused layers 5A, 5B having the power supply or ground potential are disposed in the vicinity of the input pad 2, in a case that electric carriers such as electrons injected from the diffused region 2 are concentrately implanted into the regions 5A and 5B supplied with the power supply or ground potential located nearest to the input diffusion region 2, the carriers cause a large current flow into the aluminum wirings 7A, 7B through the nearest contacts 10a, 12a. This causes faults that the junction between the diffused layer and the substrate is broken down and that a leakage current tends to occur.

Description of the Embodiments

Figure 4:
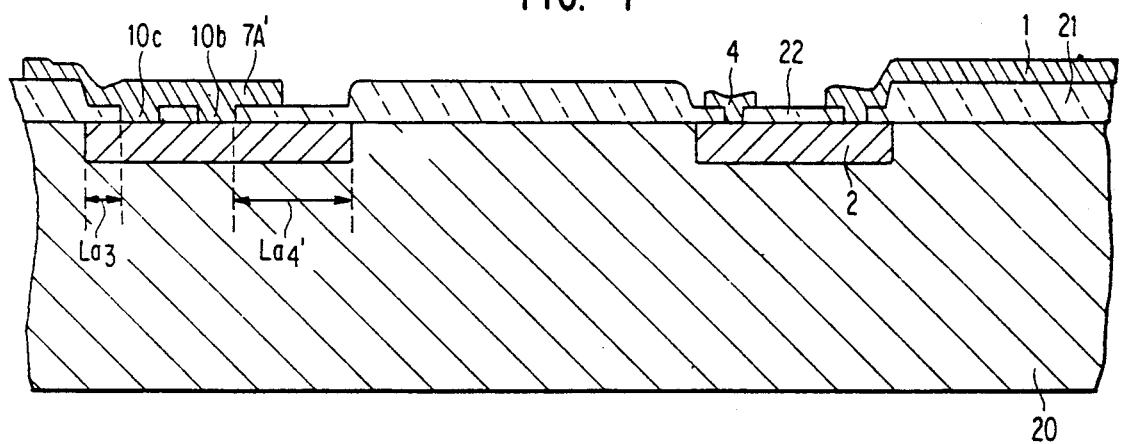
FIG. 4 is a sectional view along the axis A—A'of FIG. 3.
Figure 3:
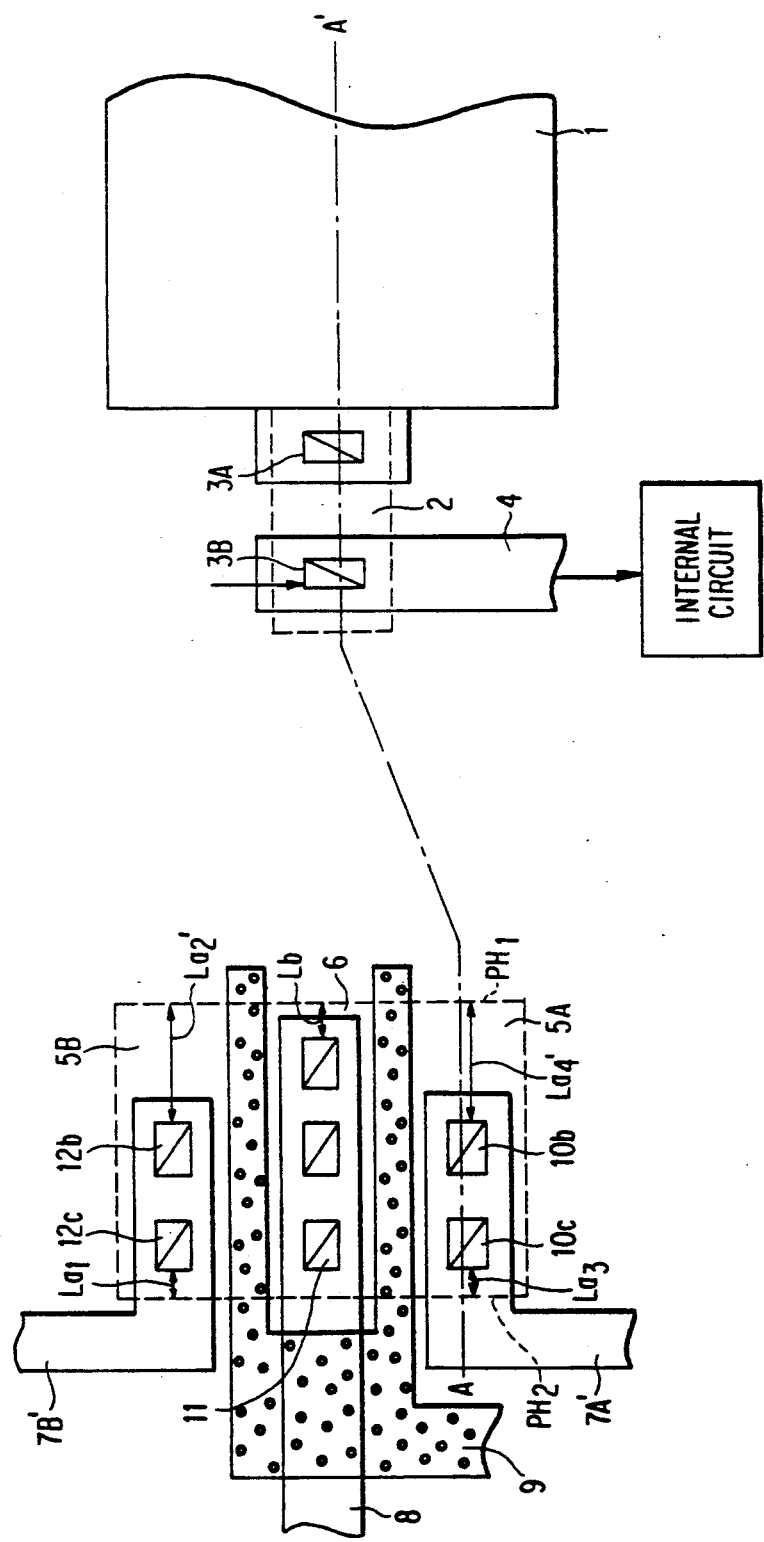
FIG. 3 is a plan view of a major part of a semconductor device according to a first embodiment of the present invention.

With reference to FIGS. 3 and 4, a semiconductor device according to a first embodiment of the present invention will be explained.

In FIGS. 3 and 4, the portions or elements corresponding to those in FIGS. 1 and 2 are denoted by the same or similar references and detailed discription therefor will be omitted.

As is seen from the drawings, the semiconductor device of the embodiment is featured in that the margin $L_{a4}'$ between a first end PH1 of the region 5A close to the input diffusion region 2 and the contact 10b is made larger than the margin $L_{a3}$ between a second end PH2 of the region 5A and the contact 10c. Also, with respect to the region 5B, the margin $L_{a2}'$ between a first end periphery of the region 5B close to the region 2 and its nearest contact 12b is made larger than the margin $L_{a1}$ between a second end periphery of the region 5B and its nearest contact 12c. In other words, the margins $L_{a2}'$ and $L_{a4}'$ are made larger than other margins $L_{a1}$, and $L_{a3}$, respectively.

According to this feature, the parasitic bipolar transistor effect formed of the region 2, the substrate 20 and the region 5A or 5B can be effectively suppressed by increasing the effective resistance between the first periphery of the region 5A or 5B and the wiring 7A' or 7B'.

In the present invention, the value of $L_{a4}'$ ($L_{a2}'$) is made set in the range of 2 to 5 times of the value of $L_{a3}$ ($L_{a1}$). If the value of $L_{a2}'$) is less than the 2 times of $L_{a3}$ ($L_{a1}$), the increase in the resistance between the first periphery an the wiring 7A' (7B') is not sufficient to prevent the parasitic bipolar transistor effect. To the contrary, if the value of $L_{a4}'$ ($L_{a2}$) is larger than the 5 times of $L_{a3}$ ($L_{a1}$), the effective source resistance of the MOS transistor is impractically increased.

Also, it is desirable to set the value of $L_{a4}'$ ($L_{a2}'$) within the range of 2 to 5 μm.

Now, assume that noise is given from outside to the input pad 1 in the forward direction in relation to the junction of th diffusion region 2 and the substrate 20. Carriers injected into the substrate 20 drift as a diffusion current in the substrate 20 and is absorbed by the nearest diffused region (5A or 5B) of a constant potential. Although this absorption is subtly by the interrelation between the impendance of the substrate and those of the contacts and the diffused regions of the occasion, the carriers are normally absorbed into the aluminum wiring (7A' or 7B') through the contacts which are made to the diffusion regions absorbing the carriers and are located nearest to the region 2. On the occasion, a large current from the first end periphery of the diffusion region is concentrated temporarily near the contact. By setting the distance $L_{a4'}$ ($L_4$) between the end and the contact to be larger sufficiently than an ordinary distance $L_{a1}$ ($L_{a1}$), the breakdown of the junction due to the impurity current can be prevented by a clamping operation of the resistance of the diffused region (5A, 5B).

Figure 5:
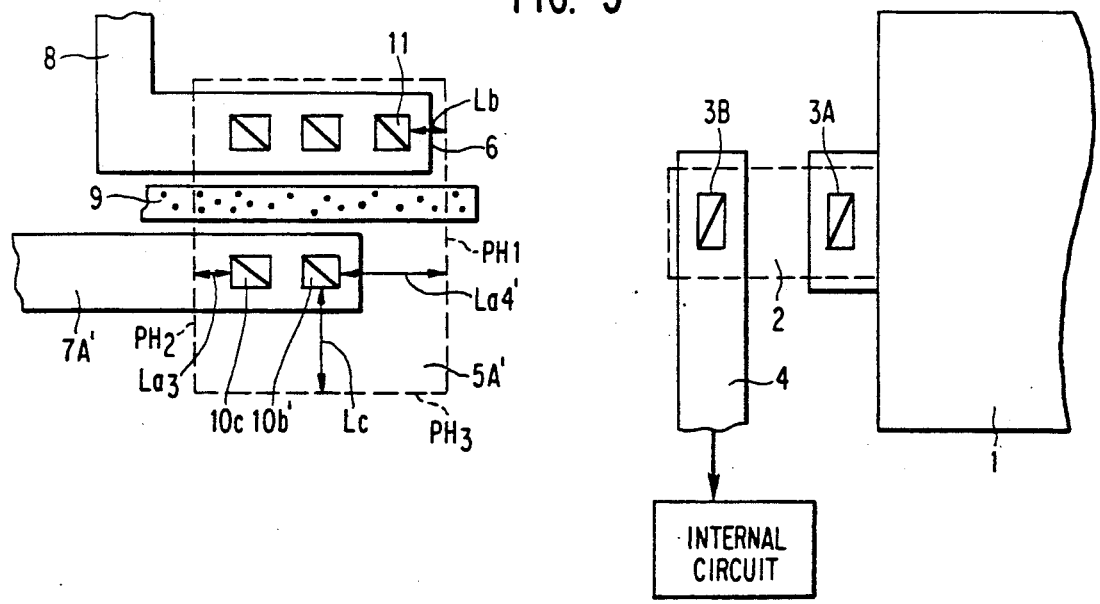
FIG. 5 is a plan view of a major part of a semiconductor device according to a second preferred embodiment of the present invention.

With reference to FIG. 5, a semiconductor device according to a second embodiment of the present invention will be explained.

According to this embodiment, the MOS transistor is composed of the drain region 6, a single source region 5A', a polycrystalline silicon gate 9, the drain wiring 8 connected to the drain region 6 through the contacts 11, and a source wiring 7A'. In this embodiment, a width of the source region 5A' is enlarged so that a distance Lc between the contact 10b' (10c) and a side periphery PH3 is made large to the value near to $L_{a4}'$.

As described above, the present invention can provide the semiconductor device being sufficiently resistant to electrostatic noise given from outside and having stable reliability accordingly, by applying minor modifications to pattern disposition in the semiconductor device which has been made heretofore.

What is claimed is:

1. A semiconductor device comprising a semiconductor substrate of a first conductivity type, an insulating layer covering a major surface of said semiconductor substrate, a first diffusion region of a second conductivity type opposite to said first conductivity type at the surface of said semiconductor substrate, said first diffusion region extending in a first direction, an external terminal, means for connecting said first diffusion region to said external terminal, a field effect transistor having a channel region, a second diffusion region arranged along a first longitudinal side of said channel region and a third diffusion region arranged along a second longitudinal side of said channel region opposite to said first longitudinal side, said channel region, said second diffusion region and said third diffusion region extending in a second direction substantially normal to said first direction, said second and third diffusion regions being of said second conductivity type, said second diffusion region formed at the major surface of said semiconductor substrate in the vicinity of said first diffusion region, said second diffusion region having a first end in the longitudinal direction closest to said first diffusion region and a second end opposite to said first end, a voltage wiring coupled to a voltage source and having a contact area directly contacted with said second diffusion region through at least one contact hole formed in said insulating layer, said first diffusion region, said second diffusion region and a part of said semiconductor substrate therebetween forming a parasitic bipolar transistor, said contact area having a first portion nearest to said first end and a second portion nearest to said second end, a first distance between said first end and said first portion being made large than a second distance between said second end and said second portion thereby to suppress operation of said parasitic bipolar transistor.

2. The semiconductor device according to claim 1, in which said first distance is 2 to 5 times said second distance.

3. The semiconductor device according to claim 1, in which said second diffusion region serves as a source of said field effect transistor.

4. The semiconductor device according to claim 1, in which said voltage wiring is formed of aluminum.

5. The semiconductor device according to claim 1, further comprising an internal circuit formed on said semiconductor substrate and coupled to said external terminal through said first diffusion region.

6. The semiconductor device according to claim 1, in which said second diffusion region has a side between said first and second ends with and a third distance between said side and a third portion of said contact area nearest to said side is made larger than said second distance.

* * * * *

UNITED STATES PATENT AND TRADEMARK OFFICE
CERTIFICATE OF CORRECTION

PATENT NO. : 5,105,256
DATED : April 14, 1992
INVENTOR(S) : Shigeru Koshimaru

It is certified that error appears in the above-identified patent and that said Letters Patent is hereby corrected as shown below:

Abstract, line 3, delete "disclosd" and insert --disclosed--;

Col. 3, line 56, delete "th" and insert --the--;

Col. 4, line 3, delete the 1st occurrence of "$L_{a1}$" and insert --$L_{a3}$--;

Col. 4, line 57, delete "large" and insert --larger--.

Signed and Sealed this

Twenty-second Day of June, 1993

Attest:

MICHAEL K. KIRK

Attesting Officer     Acting Commissioner of Patents and Trademarks